(12) United States Patent
Chiu

(10) Patent No.: US 8,248,544 B2
(45) Date of Patent: Aug. 21, 2012

(54) CAMERA MODULE WITH LIQUID CRYSTAL MODULE

(75) Inventor: Chi-Wei Chiu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 262 days.

(21) Appl. No.: 12/649,523

(22) Filed: Dec. 30, 2009

(65) Prior Publication Data

US 2010/0321595 A1   Dec. 23, 2010

(30) Foreign Application Priority Data

Jun. 18, 2009   (CN) .......................... 2009 1 0303416

(51) Int. Cl.
*G02F 1/13* (2006.01)

(52) U.S. Cl. ........................................... 349/2

(58) Field of Classification Search ........................ 349/2
See application file for complete search history.

(56) References Cited

U.S. PATENT DOCUMENTS

| | | | |
|---|---|---|---|
| 7,880,858 B2* | 2/2011 | Chen | 349/200 |
| 7,944,543 B2* | 5/2011 | Chen | 349/200 |
| 2007/0268399 A1* | 11/2007 | Kwak | 348/374 |
| 2008/0151168 A1* | 6/2008 | Sekiguchi | 349/142 |
| 2008/0252769 A1* | 10/2008 | Verstegen et al. | 348/335 |
| 2009/0020593 A1* | 1/2009 | Kinoshita et al. | 228/232 |
| 2009/0079834 A1* | 3/2009 | Otsu | 348/169 |

* cited by examiner

*Primary Examiner* — Timothy L Rude
(74) *Attorney, Agent, or Firm* — Altis Law Group, Inc.

(57) ABSTRACT

An exemplary camera module, includes a lens group, an image sensor, and a liquid crystal module disposed between the lens group and the image sensor. The liquid crystal module includes a first glass substrate adjacent to the image sensor, an opposite second glass substrate, a plurality of liquid crystal molecules arranged between the first glass substrate and the second glass substrate, a first transparent electrode layer formed on the first glass substrate and facing the liquid crystal molecules, and a second transparent electrode layer formed on the second glass substrate and facing the liquid crystal molecules. The liquid crystal molecules are configured for adjusting light path of the light transmitting therethrough in response to an electric field between the first and second transparent electrode layers, thus adjusting depth of field of the camera module.

10 Claims, 3 Drawing Sheets

CAMERA MODULE WITH LIQUID CRYSTAL MODULE

BACKGROUND

1. Technical Field

The present disclosure relates to camera modules, and particularly, to a camera module having liquid crystal module mounted therein.

2. Description of Related Art

Camera modules usually include lens groups, apertures, and image sensors.

In camera modules, depth of field is the range of distance within the field of view of the camera that is in focus at the current settings. The depth of field varies depending on aperture value, focal length as well as viewing distance. In some cases, it may be desirable to have the entire field of view sharp, and so maximum depth of field is appropriate. In other cases, a small depth of field may be more effective, emphasizing the subject while deemphasizing the foreground and background.

In a typical camera module, for a given aperture value, viewing distance, and other related parameters, the depth of field of the camera module cannot be changed.

What is needed therefore, is a camera module to overcome the above-mentioned shortcoming.

BRIEF DESCRIPTION OF THE DRAWINGS

Many aspects of the present camera module can be better understood with reference to the following drawings. The components in the drawings are not necessarily drawn to scale, the emphasis instead being placed upon clearly illustrating the principles of the present camera module. Moreover, in the drawings, like reference numerals designate corresponding parts throughout the several views.

DETAILED DESCRIPTION

Embodiments of the present camera module will now be described in detail below and with reference to the drawings.

Figure 1:
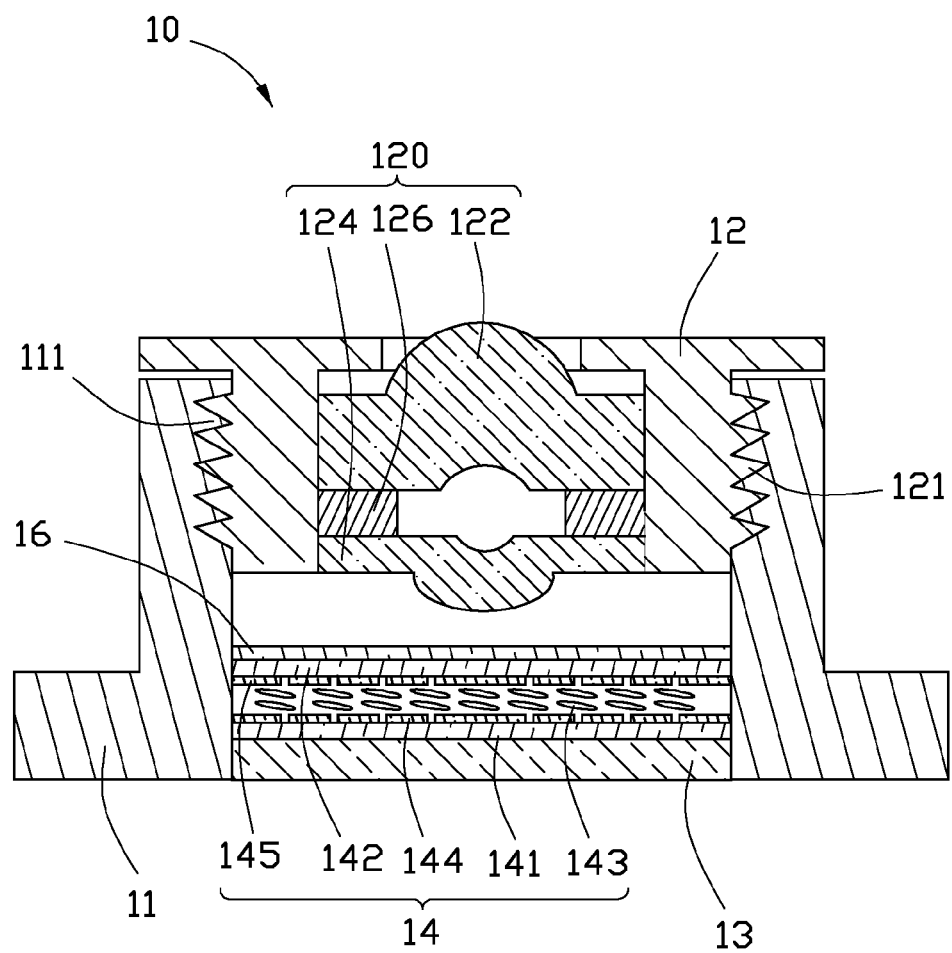
FIG. 1 is a schematic view of a camera module in accordance with a first embodiment.

Referring to FIG. 1, a camera module 10 in accordance with a first embodiment is shown. The camera module 100 includes a holder 11, a barrel 12, a lens group 120, an image sensor 13, a liquid crystal module 14, and an IR-cut filter 16.

The lens group 120 includes a first lens 122, a second lens 124, and an aperture 126 sandwiched directly between the first lens 122 and the second lens 124. The lens group 120 is received in the barrel 12. The barrel 12 and the holder 11 are threadedly engaged by the threads 111, 121 respectively formed thereon.

The image sensor 13, liquid crystal module 14, and IR-cut filter 16 are received in the holder 11. The image sensor 13 can be CCD or CMOS. The liquid crystal module 14 includes a first glass substrate 141 adjacent to the image sensor 13, an opposite second glass substrate 142, a plurality of liquid crystal molecules 143 arranged between the first glass substrate 141 and the second glass substrate 142, a first transparent electrode layer 144 formed on the first glass substrate 141, facing the liquid crystal molecules 143, and a second transparent electrode layer 145 formed on the second glass substrate 142, facing the liquid crystal molecules 143. The IR-cut filter 16 is formed on the second glass substrate 142, directly facing the lens group 120 and the barrel 12.

Preferably, the image sensor 13 directly faces the liquid crystal module 14, i.e., the image sensor 13 is proximate to the liquid crystal module 14. Light transmitting through the liquid crystal module 14 is received by the image sensor 13. In the present embodiment, the liquid crystal module 14 is directly disposed on the image sensor 13. The first and second transparent electrode layers 144, 145 cooperatively form at least a voltage difference therebetween, thereby applying an electric field on the liquid crystal module 14. All areas of the first transparent electrode layer 144 can be applied a same first voltage, and all areas of the second transparent electrode layer 145 can be applied a same second voltage which is different from the first voltage. Alternatively, a same voltage may be applied to all areas of the first transparent electrode layer 144, but voltage differences are maintained between areas of the second transparent electrode layer 145.

Figure 2:
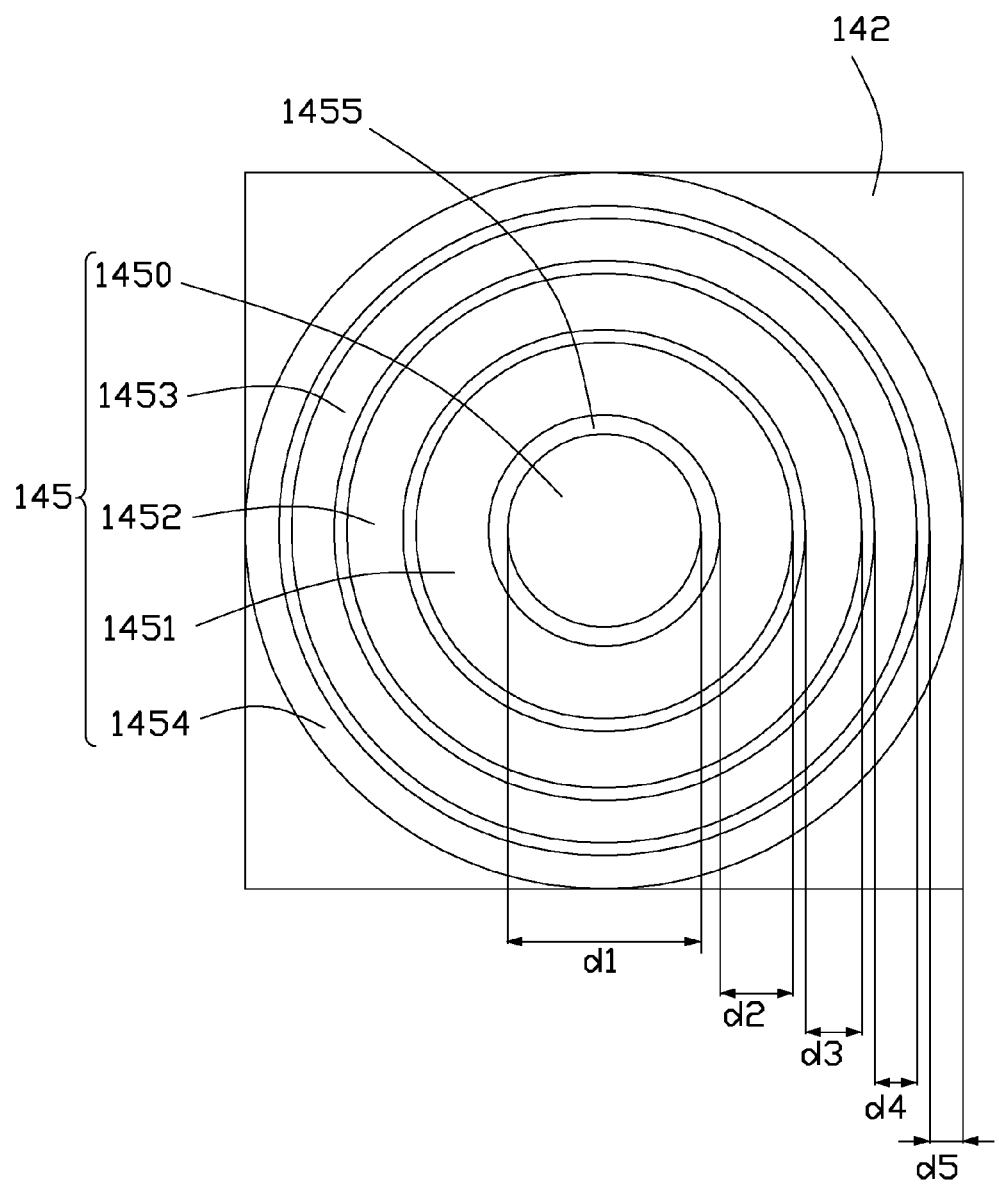
FIG. 2 is a plan view of the second transparent electrode layer of FIG. 1.

The first and second transparent electrode layers 144, 145 can have the same shape. In the present embodiment, the first and second transparent electrode layers 144, 145 are circular. Referring also to FIG. 2, the second transparent electrode layer 145 includes a circular electrode 1450, a first ring-shaped electrode 1451, a second ring-shaped electrode 1452, a third ring-shaped electrode 1453, and a fourth ring-shaped electrode 1454. The circular electrode 1450, first ring-shaped electrode 1451, second ring-shaped electrode 1452, third ring-shaped electrode 1453, and fourth ring-shaped electrode 1454 are concentrically arranged in sequence from the center of the second glass substrate 142 to the periphery of the second glass substrate 142, with a gap 1455 maintained between each two adjacent electrodes. Widths $d_1$, $d_2$, $d_3$, $d_4$, $d_5$ of the circular electrode 1450, first ring-shaped electrode 1451, second ring-shaped electrode 1452, third ring-shaped electrode 1453, and fourth ring-shaped electrode 1454 are in a relationship of $d_1 > d_2 > d_3 > d_4 > d_5$. The first transparent electrode layer 144 is formed the same as the second transparent electrode layer 145. The corresponding electrodes of the first and second transparent electrode layers 144, 145 cooperatively form a voltage difference therebetween, thereby applying an electric field on the liquid crystal molecules 143 located therebetween.

In other embodiments, the first and second transparent electrode layers 144, 145 can be in different shapes. For example, the second transparent electrode layer 145 is plate shaped, and the first transparent electrode layer 144 is formed into a dot array.

The liquid crystal molecules 143 are capable of rotating when the electric field applied thereto is changed, thus the liquid crystal molecules 143 are rearranged. The liquid crystal molecules 143 present different refraction rates to the light projected thereon in different arrangements thereof. In this way, the liquid crystal molecules 143 are capable of adjusting light path of the light, and thus the light transmitting therethrough can focus on a desired position along the optical axis of the camera module 10. That is, a focal length of the entire camera module 10 can be changed.

The focal length influences depth of field of the camera module 10. In application, for a given aperture value and viewing distance, the depth of field will be determined by the focal length, the greater the focal length, the greater the depth of field. That is, the depth of field of the camera module 10 can be changed by the liquid crystal module 14.

It is understood that the change of the depth of field also leads to change of depth of focus. That is, once the image sensor 13 is disposed within the depth of focus, the images formed by the image sensor 13 would have acceptable sharpness.

Figure 3:
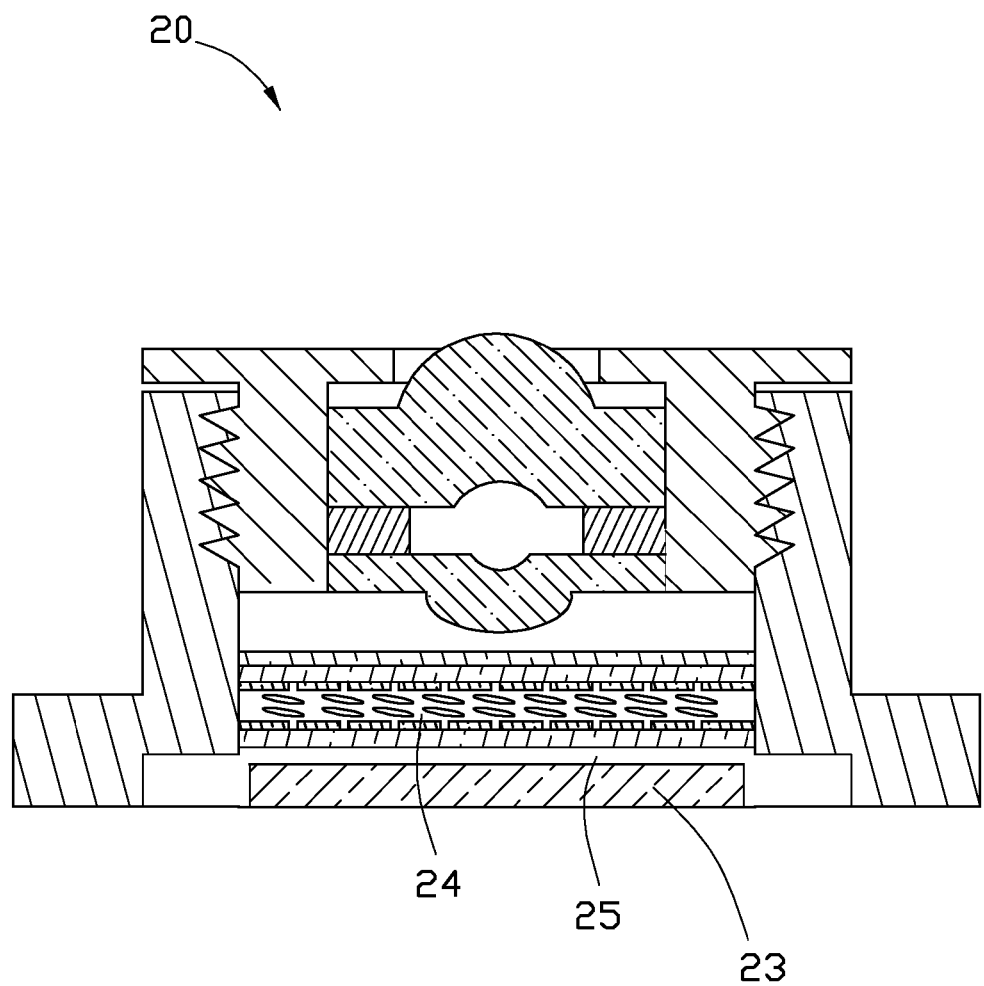
FIG. 3 is a schematic view of a camera module in accordance with a second embodiment.

Referring to FIG. 3, a camera module 20 in accordance with a second embodiment, is shown. The camera module 20 is essentially similar to the first camera module 10 illustrated above, the only difference is that a gap 25 is maintained between the image sensor 23 and the liquid crystal module 24.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A camera module, comprising:
a lens group;
an image sensor; and
a liquid crystal module disposed between the lens group and the image sensor, the liquid crystal module comprising a first glass substrate adjacent to the image sensor, an opposite second glass substrate, a plurality of liquid crystal molecules arranged between the first glass substrate and the second glass substrate, a first transparent electrode layer formed on the first glass substrate and facing the liquid crystal molecules, and a second transparent electrode layer formed on the second glass substrate and facing the liquid crystal molecules,
the liquid crystal molecules being configured for adjusting a light path of the light transmitting therethrough in response to an electric field between the first and second transparent electrode layers, thus adjusting a depth of field of the camera module,
each of the first transparent electrode layer and the second transparent electrode layer comprising a circular electrode, a first ring-shaped electrode, a second ring-shaped electrode, a third ring-shaped electrode, and a fourth ring-shaped electrode, the circular electrode, the first ring-shaped electrode, the second ring-shaped electrode, the third ring-shaped electrode, and the fourth ring-shaped electrode being concentrically arranged in sequence from the center of the first glass substrate to the periphery of the first glass substrate, with an air gap maintained between each two adjacent electrodes, and
a diameter of the circular electrode and corresponding transverse widths of the first ring-shaped electrode, the second ring-shaped electrode, the third ring-shaped electrode, and the fourth ring-shaped electrode being in a relationship of $d_1 > d_2 > d_3 > d_4 > d_5$, wherein $d_1$ represents the diameter of the circular electrode, and $d_2$, $d_3$, $d_4$, and $d_5$ represent the transverse widths of the first ring-shaped electrode, the second ring-shaped electrode, the third ring-shaped electrode, and the fourth ring-shaped electrode, respectively.

2. The camera module as described in claim 1, further comprising an IR-cut filter formed on the second glass substrate.

3. The camera module as described in claim 1, wherein the image sensor is proximate to the first glass substrate.

4. The camera module as described in claim 3, wherein the first glass substrate is disposed on the image sensor.

5. The camera module as described in claim 3, wherein a gap is maintained between the first glass substrate and the image sensor.

6. The camera module as described in claim 1, wherein both of the first and second transparent electrode layers are circular.

7. A camera module, comprising:
a lens group;
a barrel receiving the lens group therein;
a holder threadedly engaged with the barrel; and
an image sensor and a liquid crystal module received in the holder, the liquid crystal module disposed in front of the image sensor,
the liquid crystal module comprising a first glass substrate adjacent to the image sensor, an opposite second glass substrate, a plurality of liquid crystal molecules arranged between the first glass substrate and the second glass substrate, a first transparent electrode layer formed on the first glass substrate and facing the liquid crystal molecules, and a second transparent electrode layer formed on the second glass substrate and facing the liquid crystal molecules, the liquid crystal molecules being configured for adjusting a light path of the light transmitting therethrough in response to an electric field between the first and second transparent electrode layers, such that the light transmitting through the liquid crystal module focuses on a desired position,
each of the first transparent electrode layer and the second transparent electrode layer comprising a circular electrode, a first ring-shaped electrode, a second ring-shaped electrode, a third ring-shaped electrode, and a fourth ring-shaped electrode, the circular electrode, the first ring-shaped electrode, the second ring-shaped electrode, the third ring-shaped electrode, and the fourth ring-shaped electrode being concentrically arranged in sequence from the center of the first glass substrate to the periphery of the first glass substrate, with an air gap maintained between each two adjacent electrodes, and
a diameter of the circular electrode and corresponding transverse widths of the circular electrode, the first ring-shaped electrode, the second ring-shaped electrode, the third ring-shaped electrode, and the fourth ring-shaped electrode being in a relationship of $d_1 > d_2 > d_3 > d_4 > d_5$, wherein $d_1$ represents the diameter of the circular electrode, and $d_2$, $d_3$, $d_4$, and $d_5$ represent the transverse widths of the first ring-shaped electrode, the second ring-shaped electrode, the third ring-shaped electrode, and the fourth ring-shaped electrode, respectively.

8. The camera module as described in claim 7, further comprising an IR-cut filter formed on the second glass substrate.

9. The camera module as described in claim 7, wherein the image sensor directly faces the first glass substrate.

10. The camera module as described in claim 9, wherein a gap is maintained between the first glass substrate and the image sensor.

* * * * *